United States Patent
Jang et al.

(10) Patent No.: US 10,998,905 B2
(45) Date of Patent: May 4, 2021

(54) SEMICONDUCTOR APPARATUS RELATED TO RECEIVING CLOCK SIGNALS HAVING VARIABLE FREQUENCIES, AND SYSTEM INCLUDING THE SEMICONDUCTOR APPARATUS

(71) Applicant: SK hynix Inc., Icheon-si (KR)

(72) Inventors: Soo Young Jang, Seoul (KR); Geun Il Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/216,604

(22) Filed: Dec. 11, 2018

(65) Prior Publication Data

US 2020/0021291 A1   Jan. 16, 2020

(30) Foreign Application Priority Data

Jul. 13, 2018   (KR) .................. 10-2018-0081435

(51) Int. Cl.
*H03K 19/017* (2006.01)
*G06F 1/06* (2006.01)
*H03K 5/135* (2006.01)

(52) U.S. Cl.
CPC ......... *H03K 19/01728* (2013.01); *G06F 1/06* (2013.01); *H03K 5/135* (2013.01)

(58) Field of Classification Search
None
See application file for complete search history.

(56) References Cited

U.S. PATENT DOCUMENTS

| | | | | |
|---|---|---|---|---|
| 5,774,702 A * | 6/1998 | Mitsuishi | ............ | G06F 1/08 713/501 |
| 6,597,213 B1 * | 7/2003 | Weintraub | ........ | H03K 5/00006 327/117 |
| 9,190,129 B2 | 11/2015 | Linam et al. | | |
| 9,971,733 B1 * | 5/2018 | Teh | ............ | G06F 15/7803 |
| 2003/0229815 A1 * | 12/2003 | Fujiwara | ............ | G06F 1/06 713/500 |
| 2008/0052481 A1 * | 2/2008 | Oh | ............ | G11C 7/22 711/167 |
| 2010/0097527 A1 * | 4/2010 | Shin | ............ | G09G 5/008 348/723 |
| 2014/0049327 A1 * | 2/2014 | Bruset | ............ | G06F 1/08 331/44 |
| 2017/0004869 A1 * | 1/2017 | Shin | ............ | G11C 11/4076 |
| 2017/0017587 A1 * | 1/2017 | West | ............ | G06F 13/4068 |
| 2017/0272062 A1 * | 9/2017 | Lu | ............ | H03D 7/1466 |
| 2018/0082726 A1 * | 3/2018 | Kang | ............ | G11C 7/222 |
| 2018/0102151 A1 * | 4/2018 | Kim | ............ | G11C 7/1093 |

* cited by examiner

*Primary Examiner* — Crystal L Hammond
(74) *Attorney, Agent, or Firm* — William Park & Associates Ltd.

(57) ABSTRACT

A system may include an external apparatus and a semiconductor apparatus. The semiconductor apparatus may be configured to communicate with the external apparatus by receiving a frequency-varying first clock signal provided from the external apparatus.

16 Claims, 3 Drawing Sheets

SEMICONDUCTOR APPARATUS RELATED TO RECEIVING CLOCK SIGNALS HAVING VARIABLE FREQUENCIES, AND SYSTEM INCLUDING THE SEMICONDUCTOR APPARATUS

CROSS-REFERENCE TO RELATED APPLICATION

The present application claims priority under 35 U.S.C. § 119(a) to Korean application number 10-2018-0081435, filed on Jul. 13, 2018, in the Korean Intellectual Property Office, which is incorporated herein by reference in its entirety as set forth in full.

BACKGROUND

1. Technical Field

Various embodiments of the present disclosure relate to an integrated circuit technology and, more particularly, to a semiconductor apparatus and a system including the semiconductor apparatus.

2. Related Art

An electronic device includes a lot of electronic elements, and a computer system includes lots of semiconductor apparatuses each comprising a semiconductor. The semiconductor apparatuses configuring the computer system can communicate with one another by providing and receiving a clock signal and data. As the operation speed of the computer system increases, a semiconductor apparatus having a fast operation speed is wanted. Therefore, a frequency of the clock signal increases for high-speed data communication among the semiconductor apparatuses. Particularly, graphic semiconductor apparatuses have a data rate of 16 Gbps through the clock signal of 8 GHz or higher, for example.

SUMMARY

In an embodiment of the present disclosure, a system may include an external apparatus, and a semiconductor apparatus. The external apparatus may be configured to provide a first clock signal and a second clock signal. The semiconductor apparatus may be configured to communicate with the external apparatus by receiving the first clock signal and the second clock signal. The first clock signal may have a first frequency and a second frequency higher than the first frequency. The second clock signal may have a third frequency lower than the first frequency.

In an embodiment of the present disclosure, a system may include an external apparatus, and a semiconductor apparatus. The semiconductor apparatus may be configured to communicate with the external apparatus by receiving a frequency-varying first clock signal provided from the external apparatus.

DETAILED DESCRIPTION

Hereinafter, a semiconductor apparatus according to the present disclosure will be described below with reference to the accompanying drawings through various embodiments.

Figure 1:
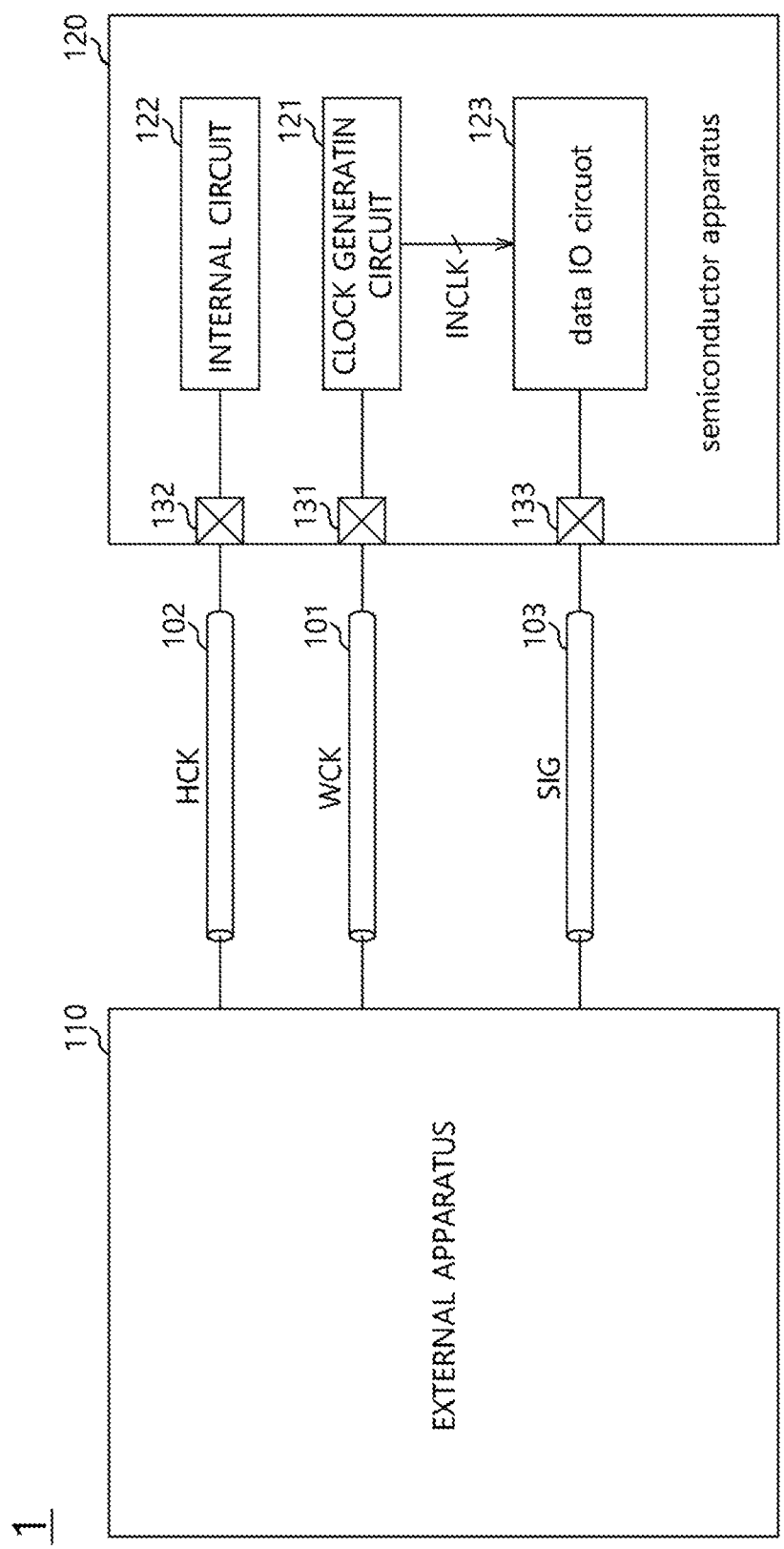
FIG. 1 is a diagram illustrating a configuration of a system in accordance with an embodiment.

FIG. 1 is a diagram illustrating a configuration of a system 1 in accordance with an embodiment. Referring to FIG. 1, the system 1 may include an external apparatus 110 and a semiconductor apparatus 120. The external apparatus 110 may provide various control signals required for the semiconductor apparatus 120 to operate. The external apparatus 110 may include apparatuses of various kinds. For example, the external apparatus 110 may be a host apparatus such as a central processing unit (CPU), a graphic processing unit (GPU), a multi-media processor (MMP), a digital signal processor, an application processor (AP) and a memory controller. Also, the external apparatus 110 may be a test apparatus or a test equipment configured to test the semiconductor apparatus 120. The semiconductor apparatus 120 may be a memory apparatus, and the memory apparatus may include a volatile memory apparatus and a non-volatile memory apparatus. The volatile memory apparatus may include a static random access memory (static RAM: SRAM) and a dynamic RAM (DRAM), a synchronous DRAM (SDRAM). The non-volatile memory apparatus may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The semiconductor apparatus 120 may perform a test operation with coupled to the external apparatus 110 serving as a test equipment. The semiconductor apparatus 120 may perform various operations except when a test operation is performed between the semiconductor apparatus 120 and the test equipment, by being coupled to the external apparatus 110 which serves as the host apparatus. For example, the semiconductor apparatus 120 may be tested, after the manufacture thereof, by being coupled to the external apparatus 110 which serves as the test equipment. After the completion of the test thereon, the semiconductor apparatus 120 may perform various operations by being coupled to the external apparatus 110 which serves as a host apparatus.

The semiconductor apparatus 120 may be coupled to the external apparatus 110 through a plurality of buses. The plurality of buses may be signal transmission paths, links or channels. Each of the plurality of buses may include a command address bus, a clock bus, the data bus and so forth. FIG. 1 illustrates only clock buses 101 and 102 configured to transfer clock signals and a signal bus 103 configured to transfer a synchronized signal. The signal bus 103 may be one-way buses and the signal bus 103 may be a one-way bus or a two-way bus. The external apparatus 110 may generate a first clock signal WCK and a second clock signal HCK and may provide the semiconductor apparatus 120 with the first clock signal WCK and the second clock signal HCK. The external apparatus 110 may provide the first clock signal WCK through the first clock bus 101 and may provide the second clock signal HCK through the second clock bus 102. Although not illustrated, the external apparatus 110 may include a clock generation circuit such as a phase-locked loop circuit or a delay-locked loop circuit to generate the first clock signal WCK and the second clock signal HCK.

The semiconductor apparatus 120 may be coupled to the external apparatus 110 through the first clock bus 101 and may receive the first clock signal WCK through the first clock bus 101. The first clock signal WCK may include a pair of differential clock signals. The semiconductor apparatus 120 may communicate with the external apparatus 110 by receiving the first clock signal WCK provided from the external apparatus 110. The semiconductor apparatus 120 may receive the second clock signal HCK provided from the external apparatus 110 through the second clock bus 102. The second clock signal HCK may include a pair of differential clock signals. The semiconductor apparatus 120 may communicate with the external apparatus 110 by receiving the second clock signal HCK provided from the external apparatus 110. The semiconductor apparatus 120 may be coupled to the external apparatus 110 through the signal bus 103. The semiconductor apparatus 120 may receive a synchronized signal SIG provided from the external apparatus 110 or may provide the synchronized signal SIG to the external apparatus 110, through the signal bus 103. The synchronized signal SIG may include any signal provided as synchronized to any one between the first clock signal WCK and the second clock signal HCK. For example, the synchronized signal SIG may be data, a command signal or an address signal.

In accordance with an embodiment of the present invention, the first clock signal WCK may have a lower frequency than the second clock signal HCK. The frequency of the first clock signal WCK may be variable while the frequency of the second clock signal HCK may be fixed. The first clock signal WCK may have a first frequency and a second frequency. The second clock signal HCK may have a third frequency. The first frequency may be lower than the second frequency and the third frequency may be lower than the first frequency. For example, the second frequency may be double of the first frequency and the first frequency may be double of the third frequency. The first clock signal WCK may include at least one pulse having the first frequency and a pulse having the second frequency. The at least one pulse having the first frequency may be first transferred as the first clock signal WCK and then the pulse having the second frequency may be transferred as the first clock signal WCK. The first clock signal WCK may include a preamble period. The preamble period may be an initial period, during with the first clock signal WCK is transferred. During the preamble period, a clock signal having the first frequency may be transferred as the first clock signal WCK. After the preamble period, a clock signal having the second frequency may be transferred as the first clock signal WCK.

In accordance with an embodiment, the second clock signal HCK may be provided from the external apparatus 110 to the semiconductor apparatus 120 regardless of the operation of the semiconductor apparatus 120. The first clock signal WCK may be provided from the external apparatus 110 to the semiconductor apparatus 120 when the synchronized signal SIG is transferred between the external apparatus 110 and the semiconductor apparatus 120. In an embodiment, the synchronized signal SIG may be data, and the first clock signal WCK may be provided from the external apparatus 110 to the semiconductor apparatus 120 during the write operation or the read operation. The first clock signal WCK may be provided from the external apparatus 110 to the semiconductor apparatus 120 at the same time or before when the synchronized signal SIG is transferred between the external apparatus 110 and the semiconductor apparatus 120. The write operation may be an operation of transferring data from the external apparatus 110 to the semiconductor apparatus 120 and the read operation may be an operation of transferring data from the semiconductor apparatus 120 to the external apparatus 110.

The semiconductor apparatus 120 may include a clock generation circuit 121, an internal circuit 122 and a data input/output (IO) circuit 123. The clock generation circuit 121 may be coupled to the first clock bus 101 through a clock pad 131 and may generate a plurality of internal clocks INCLK by receiving the first clock signal WCK. The semiconductor apparatus 120 may synchronize the synchronized signal SIG, which is transferred through the signal bus 103, to the first clock signal WCK and may receive and/or sample the synchronized signal SIG. The semiconductor apparatus 120 may frequency-divide and use the first clock signal WCK in order to secure an enough timing margin for receiving and/or sampling the synchronized signal SIG. The clock generation circuit 121 may generate the plurality of internal clocks INCLK by frequency-dividing the first clock signal WCK. Since the semiconductor apparatus 120 receives the first clock signal WCK only during a particular period when the synchronized signal SIG is transferred therein and therefrom, there may occur a case that the first clock signal WCK and the second clock signal HCK are out of phase. Therefore, the semiconductor apparatus 120 may perform an operation of synchronizing the phase of the first clock signal WCK to the phase of the second clock signal HCK.

The internal circuit 122 may include, among logic circuits configuring the semiconductor apparatus 120, any logic circuit except for the clock generation circuit 121 and the data IO circuit 123. The internal circuit 122 may be coupled to the second clock bus 102 through a clock pad 132. The internal circuit 122 may receive the second clock signal HCK through the second clock bus 102. The internal circuit 122 may perform various operations based on the second clock signal HCK. For example, the internal circuit 122 may receive a command signal and/or a control signal (such as an address signal) from the external apparatus 110 based on the second clock signal HCK. For example, the semiconductor apparatus 120 may enter a sleep mode (such as a power down mode, a standby mode or a deep power down mode) or may enter an active mode by getting out of the sleep mode, based on the command signal received as synchronized to the second clock signal HCK.

The data IO circuit 123 may be coupled to the signal bus 103 through a signal pad 133. The data IO circuit 123 may receive the synchronized signal SIG provided from the external apparatus 110 or provide the synchronized signal SIG to the external apparatus 110. The data IO circuit 123 may receive the plurality of internal clocks INCLK generated by the clock generation circuit 121. When the synchronized signal SIG includes data, the data IO circuit 123 may perform an input/output (IO) operation of the data based on the plurality of internal clocks INCLK. The data IO circuit 123 may provide, in synchronization with the plurality of internal clocks INCLK, the external apparatus 110 with data and may receive, in synchronization with the plurality of internal clocks INCLK, data provided from the external apparatus 110.

Figure 2:
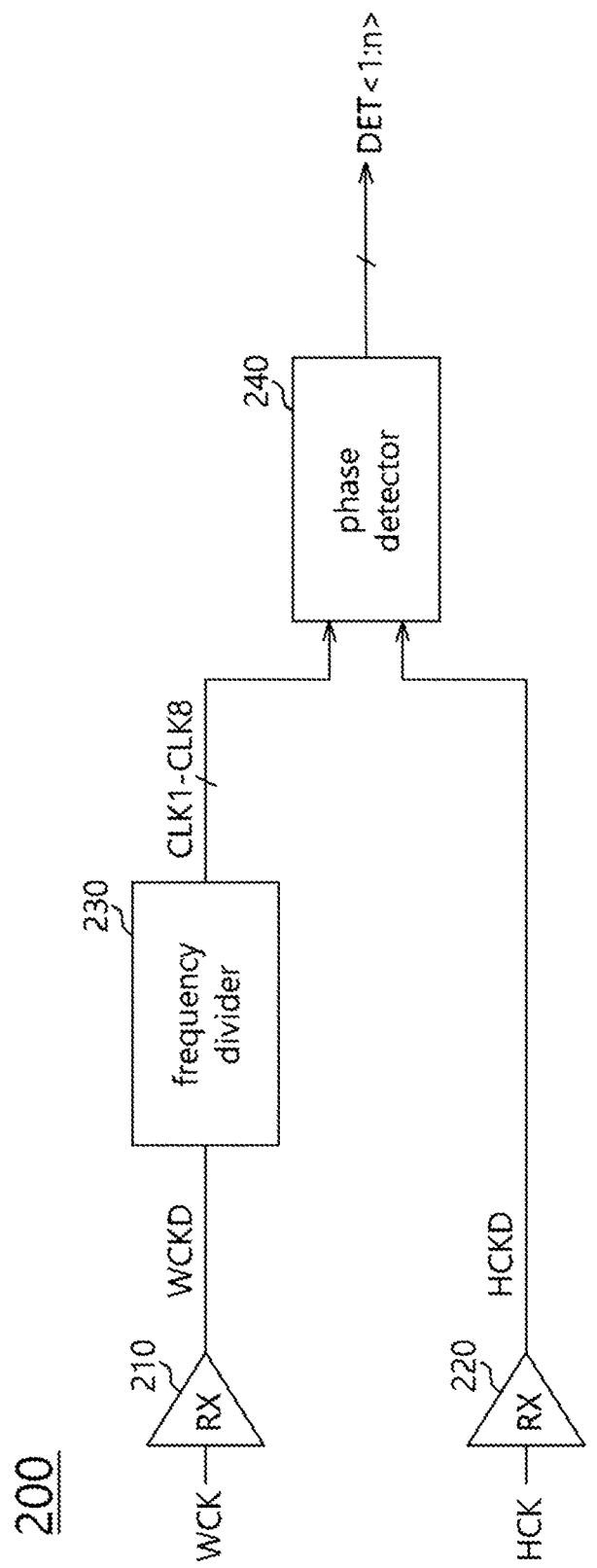
FIG. 2 is a diagram illustrating at least a partial configuration of a semiconductor apparatus in accordance with an embodiment.

FIG. 2 is a diagram illustrating a representation of an example of at least a partial configuration of a semiconductor apparatus 200 in accordance with an embodiment of the present disclosure. Referring to FIG. 2, the semiconductor apparatus 200 may include a first receiver (RX) 210, a second receiver (RX) 220, a frequency divider 230 and a phase detector 240. The semiconductor apparatus 200 may be implemented as the semiconductor apparatus 120 described with reference to FIG. 1, and the first receiver 210, the frequency divider 230 and the phase detector 240 may be included in the clock generation circuit 121. The first receiver 210 may receive the first clock signal WCK. The first receiver 210 may receive the first clock signal WCK including the pair of differential clock signals and may buffer the first clock signal WCK. In an embodiment, the first clock signal WCK may be a single ended signal. The first receiver 210 may generate a buffered first clock signal WCKD by differentially amplifying the first clock signal WCK and a reference voltage. The reference voltage may have a voltage level corresponding to a middle of the swing width of the first clock signal WCK. The second receiver 220 may receive the second clock signal HCK. The second receiver 220 may receive the second clock signal HCK including the pair of differential clock signals and may buffer the second clock signal HCK. In an embodiment, the second clock signal HCK may be a single ended signal. The second receiver 220 may generate a buffered second clock signal HCKD by differentially amplifying the second clock signal HCK and a reference voltage. The reference voltage may have a voltage level corresponding to a middle of a swing width of the second clock signal HCK.

The frequency divider 230 may receive the first clock signal WCK. The frequency divider 230 may generate at least one internal clock signal by receiving the buffered first clock signal WCKD through the first receiver 210 and dividing the frequency of the buffered first clock signal WCKD. The frequency divider 230 may generate a plurality of internal clock signals each having different phase from one another by dividing the frequency of the buffered first clock signal WCKD by two, four or eight. For example, the frequency divider 230 may generate 8 internal clock signals CLK1 to CLK8 by dividing the buffered first clock signal WCKD by four. Each of the 8 internal clock signals CLK1 to CLK8 may have four times lower frequency or four times longer period than the first clock signal WCK. Each of the 8 internal clock signals CLK1 to CLK8 may have a phase difference by an amount of 45° from one another. Each of the 8 internal clock signals CLK1 to CLK8 may have substantially the same frequency or period as the second clock signal HCK.

The phase detector 240 may receive the second clock signal HCK and at least one among the 8 internal clock signals CLK1 to CLK8. For example, the phase detector 240 may receive the first internal clock signal CLK1. The phase detector 240 may compare the phases between the first internal clock signal CLK1 and the buffered second clock signal HCKD and may generate a phase detection signal DET<1:n> according to the result of the phase comparison. The phase detection signal DET<1:n> may be generated as a code signal including one or more bits. The phase detector 240 may generate the phase detection signal DET<1:n> having information whether the first clock signal WCK and the second clock signal HCK are in phase by determining whether the phase of the first internal clock signal CLK1 lags behind or leads the phase of the buffered second clock signal HCKD. The phase detection signal DET<1:n> may be used to adjust the phase of the first clock signal WCK. In an embodiment, the phase detection signal DET<1:n> may be feedback to the external apparatus 110 described with reference to FIG. 1. The external apparatus 110 may advance or delay the phase of the first clock signal WCK based on the phase detection signal DET<1:n>. In an embodiment, the phase detection signal DET<1:n> may be provided to a delay circuit disposed within the semiconductor apparatus 120. The semiconductor apparatus 120 may advance or delay the phase of the first clock signal WCK through the delay circuit.

Figure 3:
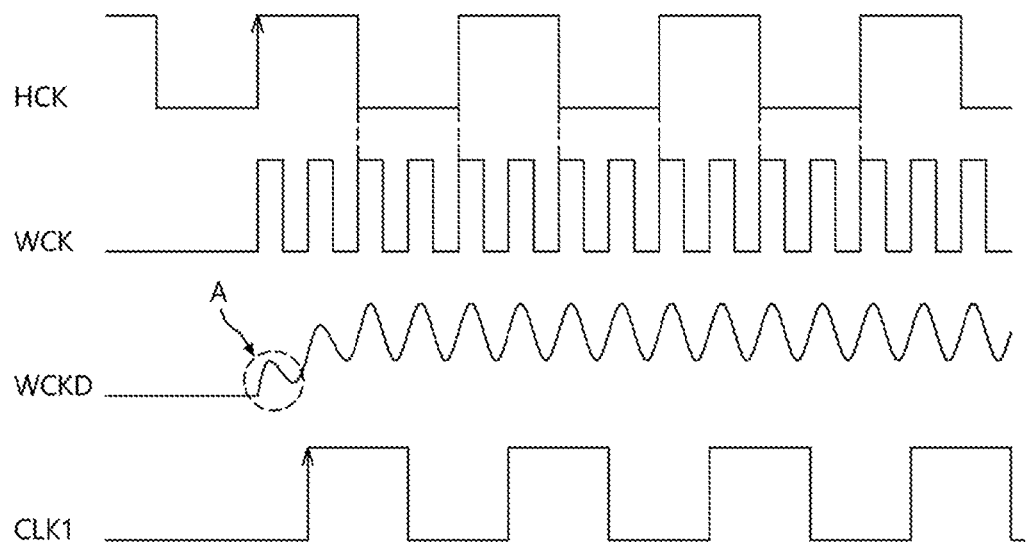
FIG. 3 is a diagram illustrating an operation of a semiconductor apparatus.
Figure 4:
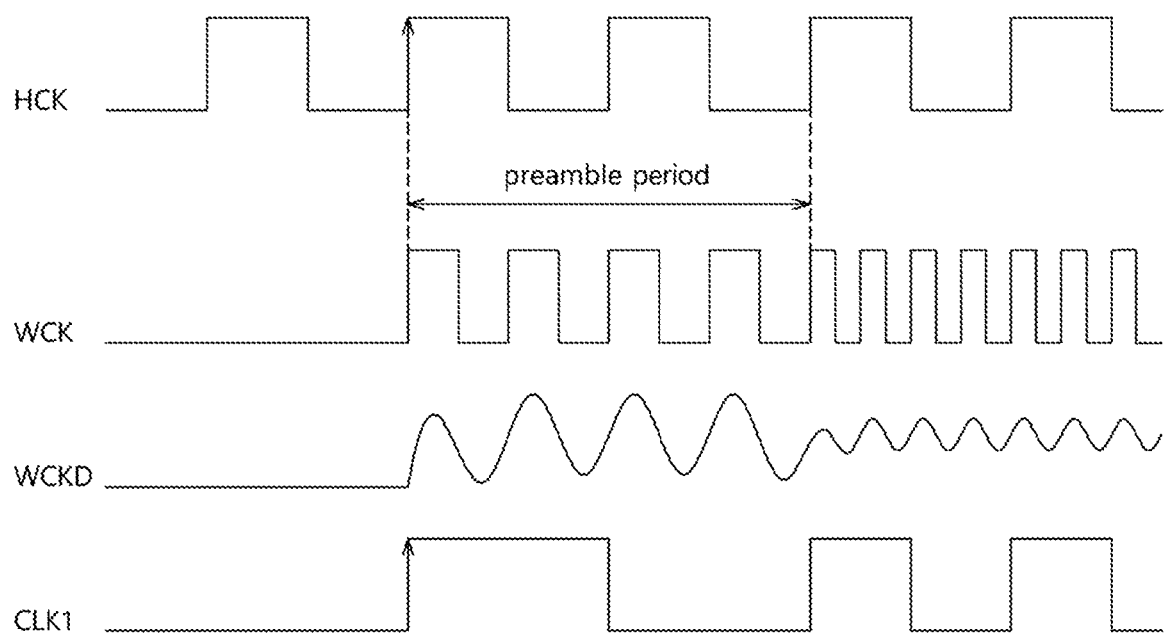
FIG. 4 is an example of an operation of a semiconductor apparatus in accordance with an embodiment.

FIG. 3 is a diagram illustrating an operation of a general semiconductor apparatus and FIG. 4 is a diagram illustrating a representation of an example of an operation of the semiconductor apparatus 120 or 200 in accordance with an embodiment of the present disclosure. Described hereinafter with reference to FIGS. 1 to 4 will be an operation of the semiconductor apparatus 120 or 200 in accordance with an embodiment of the present disclosure. Regardless of the operation status of the semiconductor apparatus 120 or 200, the external apparatus 110 may provide the semiconductor apparatus 120 or 200 with the second clock signal HCK having the third frequency and the semiconductor apparatus 120 or 200 may receive the second clock signal HCK. When the external apparatus 110 provides the semiconductor apparatus 120 or 200 the synchronized signal SIG or the semiconductor apparatus 120 or 200 provides the external apparatus 110 with the synchronized signal SIG, the external apparatus 110 may provide the semiconductor apparatus 120 or 200 with the first clock signal WCK. According to the prior art, the external apparatus 110 provides the semiconductor apparatus 120 or 200 with the first clock signal WCK having the second frequency. The second frequency may be four times higher than the third frequency and an amplitude of a clock signal may become smaller as a frequency becomes higher. Therefore, a first pulse A of the buffered first clock signal WCKD may not have a correct amplitude even when the first receiver 210 buffers the first clock signal WCK. The frequency divider 230 divides the frequency of the buffered first clock signal WCKD by detecting a second pulse of the buffered first clock signal WCKD without capability of detecting the first pulse A of the buffered first clock signal WCKD. Therefore, a first frequency-divided clock signal CLK1, which is generated by the frequency divider 230, and the second clock signal HCK may be out of phase. The frequency-divided clock signal CLK1 may have a lagging phase behind the phase of the second clock signal HCK. The above described problem may occur constantly even when the phase detector 240 generates the phase detection signal DET<1:n> by comparing the phases between the frequency-divided clock signal CLK1 and the second clock signal HCK and the phase of the second clock signal HCK is adjusted on the basis of the phase detection signal DET<1:n>.

Within the system 1 in accordance with an embodiment of the present disclosure, the external apparatus 110 may provide, as the first clock signal, WCK a clock signal having the first frequency lower than the second frequency during the initial period and/or the preamble period, in which the first clock signal WCK is transferred; and may provide, as the first clock signal WCK, a clock signal having the second frequency after the initial period and/or the preamble period. For example, the clock signal having the second frequency may be provided during two cycles of the period of the second clock signal HCK. The preamble period may be from when the first clock signal WCK starts to be transferred to when the two times of the period of the second clock signal HCK elapses. Since the first clock signal WCK has the first frequency during the initial phase of the transmission, the first clock signal WCK may have greater amplitude than the clock signal having the second frequency. Therefore, the first clock signal WCKD buffered by the first receiver 210 may have greater amplitude than the buffered first clock signal WCKD described with reference to FIG. 3. Therefore, the first pulse of the buffered first clock signal WCKD may have the sufficient amplitude such that the frequency divider 230 can detect the first pulse of the buffered first clock signal WCKD. Since the first clock signal WCKD buffered by the first receiver 210 has the sufficient amplitude even when the clock signal having the second frequency is provided as the first clock signal WCK after the preamble period, the frequency divider 230 may divide the frequency of the buffered first clock signal WCKD by precisely detecting the buffered first clock signal WCKD. Therefore, the first frequency-divided clock signal CLK1 may be generated such that the first frequency-divided clock signal CLK1 and the second clock signal HCK are in phase. The synchronized signal SIG may be transferred in synchronized to the first clock signal WCK after the preamble period.

While certain embodiments have been described above, it will be understood to those skilled in the art that the embodiments described are by way of example only. Accordingly, the semiconductor apparatus receiving clock signals having variable frequencies, and system including the semiconductor apparatus should not be limited based on the described embodiments. Rather, the semiconductor apparatus receiving clock signals having variable frequencies, and system including the semiconductor apparatus described herein should only be limited in light of the claims that follow when taken in conjunction with the above description and accompanying drawings.

What is claimed is:

1. A system comprising:
   an external apparatus configured to provide a first clock signal and a second clock signal; and
   a semiconductor apparatus configured to communicate with the external apparatus by receiving the first clock signal and the second clock signal,
   wherein the first clock signal has a first frequency and a second frequency higher than the first frequency, and the second clock signal has a third frequency lower than the first frequency,
   wherein the first clock signal has the first frequency for a preamble period and then has the second frequency after the preamble period.

2. The system of claim 1, wherein the second frequency is double the first frequency and the first frequency is double the third frequency.

3. The system of claim 1, wherein the first clock signal is transferred from the external apparatus to the semiconductor apparatus when a synchronized signal is transferred between the external apparatus and the semiconductor apparatus, and the synchronized signal is transferred in synchronization with the first clock signal.

4. The system of claim 1, wherein the external apparatus provides the first clock signal including at least one pulse having the first frequency and a pulse having the second frequency.

5. The system of claim 1, wherein the semiconductor apparatus includes:
   a frequency divider configured to generate at least one internal clock signal by dividing a frequency of the first clock signal; and
   a phase detector configured to generate a phase detection signal by comparing phases between the at least one internal clock signal and the second clock signal.

6. The system of claim 5, wherein the phase detection signal is feedback to the external apparatus, and the external apparatus changes a phase of the first clock signal based on the phase detection signal.

7. The system of claim 5, wherein the semiconductor apparatus further includes a data input and output (input/output) circuit configured to receive, in synchronization with the at least one internal clock signal, a synchronized signal provided from the external apparatus or configured to provide, in synchronization with the at least one internal clock signal, the synchronized signal to the external apparatus.

8. A system comprising:
   an external apparatus; and
   a semiconductor apparatus configured to communicate with the external apparatus by receiving a frequency-varying first clock signal and a frequency-fixed second clock signal provided from the external apparatus,
   wherein the frequency-varying first clock signal has a first frequency in an initial phase of transmission, and then has a second frequency which is higher than the first frequency.

9. The system of claim 8, wherein the second frequency is double the first frequency.

10. The system of claim 8, wherein the first clock signal includes a preamble period, a clock signal having the first frequency is provided as the first clock signal during the preamble period, and a clock signal having the second frequency is provided as the first clock signal after the preamble period.

11. The system of claim 8, wherein the second clock signal has a lower frequency than the first clock signal.

12. The system of claim 8, wherein the semiconductor apparatus includes:
    a frequency divider configured to generate at least one internal clock signal by dividing a frequency of the first clock signal; and
    a phase detector configured to generate a phase detect signal by comparing phases between the at least one internal clock signal and the second clock signal.

13. The system of claim 12, wherein the phase detection signal is feedback to the external apparatus, and the external apparatus changes a phase of the first clock signal based on the phase detection signal.

14. The system of claim 12, wherein the semiconductor apparatus further includes a data input and output (input/output) circuit configured to receive, in synchronization with the at least one internal clock signal, a synchronized signal provided from the external apparatus or configured to provide, in synchronization with the at least one internal clock signal, the synchronized signal to the external apparatus.

15. The system of claim 14, wherein the first clock signal is transferred from the external apparatus to the semiconductor apparatus when the synchronized signal is transferred between the external apparatus and the semiconductor apparatus.

16. A system comprising:
    an external apparatus; and
    a semiconductor apparatus configured to communicate with the external apparatus by receiving, a frequency-varying first clock signal of which a frequency is varied between a first frequency and a second frequency and a frequency-fixed second clock signal of which a frequency is a third frequency, provided from the external apparatus,
    wherein the first clock signal has the first frequency for a preamble period and then has the second frequency after the preamble period.

* * * * *